(12) United States Patent
Ergen et al.

(10) Patent No.: US 10,403,708 B2
(45) Date of Patent: Sep. 3, 2019

(54) GRADED BANDGAP PEROVSKITE SOLAR CELL

(71) Applicants: Onur Ergen, Berkeley, CA (US); Alexander K. Zettl, Kensington, CA (US)

(72) Inventors: Onur Ergen, Berkeley, CA (US); Alexander K. Zettl, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 240 days.

(21) Appl. No.: 15/451,842

(22) Filed: Mar. 7, 2017

(65) Prior Publication Data

US 2018/0366539 A1 Dec. 20, 2018

Related U.S. Application Data

(60) Provisional application No. 62/305,933, filed on Mar. 9, 2016.

(51) Int. Cl.
*H01L 21/02* (2006.01)
*H01L 49/02* (2006.01)
*B01J 23/00* (2006.01)

(52) U.S. Cl.
CPC ............ *H01L 28/55* (2013.01); *B01J 23/002* (2013.01); *H01L 28/75* (2013.01)

(58) Field of Classification Search
None
See application file for complete search history.

(56) References Cited

U.S. PATENT DOCUMENTS

| 6,197,719 | B1 | 3/2001 | Choudhary |
| 7,070,752 | B2 | 7/2006 | Zeng |
| 7,095,067 | B2 | 8/2006 | Hwang |
| 7,700,981 | B2 | 4/2010 | Goux |
| 7,883,906 | B2 | 2/2011 | Goux |
| 2009/0280355 | A1* | 11/2009 | Eom ...................... C30B 23/02 428/701 |
| 2009/0309135 | A1* | 12/2009 | Udagawa .............. H01L 29/045 257/201 |

(Continued)

FOREIGN PATENT DOCUMENTS

| KR | 2015084702 A | * | 7/2015 | ............. H01L 51/42 |
| WO | WO-2012050443 A1 | * | 4/2012 | ........... H01L 51/107 |

OTHER PUBLICATIONS

Ergen, O. et al. Graded bandgap perovskite solar cells. Nature Materials, advance online publication (2016).

(Continued)

*Primary Examiner* — Calvin Y Choi (57) ABSTRACT

This disclosure provides systems, methods, and apparatus related to solar cells. In one aspect a solar cell includes a first electrode, a hole transport layer disposed on the first electrode, a first perovskite layer disposed on the hole transport layer, a cationic diffusion barrier disposed on the first perovskite layer, a second perovskite layer disposed on the cationic diffusion barrier, an electron transport layer disposed on the second perovskite layer, and a second electrode disposed on the electron transport layer. The first perovskite layer comprises a different perovskite than the second perovskite layer.

20 Claims, 8 Drawing Sheets

(56) References Cited

U.S. PATENT DOCUMENTS

| | | | | |
|---|---|---|---|---|
| 2010/0155879 A1* | 6/2010 | Schulze | ............ | H01L 27/0207 257/503 |
| 2016/0005547 A1* | 1/2016 | Seok, II | ............ | H01L 51/4226 136/255 |
| 2016/0005987 A1* | 1/2016 | Koposov | ............ | H01L 51/4226 136/263 |
| 2016/0020411 A1* | 1/2016 | Lee | ............ | H01L 51/0077 136/255 |

OTHER PUBLICATIONS

Jeon, N. J. et al. Compositional engineering of perovskite materials for high-performance solar cells. Nature 517, 476-480 (2015).

Zhou, H. et al. Interface engineering of highly efficient perovskite solar cells. Science 345,542-546 (2014).

Green, M. A., et al. Solar cell efficiency tables (version 45). Prog. Photovolt. Res. Appl. 23, 1-9 (2015).

Saliba, M. et al. Cesium-containing triple cation perovskite solar cells: improved stability, reproducibility and high efficiency. Energy Environ. Sci. 9, 1989-1997 (2016).

Noel, N. K. et al. Lead-free organic—inorganic tin halide perovskites for photovoltaic applications. Energy Environ. Sci. 7, 3061-3068 (2014).

Bailie, C. D. et al. Semi-transparent perovkite solar cells for tandems with silicon and CIGS. Energy Environ. Sci. 8, 956-963 (2015).

Loper, P. et al. Organic-inorganic halide perovskite/crystalline silicon four-terminal tandem solar cells. Phys. Chem. Chem. Phys. 17, 1619-1629 (2015).

Werner, J. et al. Sputtered rear electrode with broadband transparency for perovkite solar cells. Sol. Energy Mater. Sol. Cells 141, 407-413 (2015).

Mailoa, J. P. et al. A 2-terminal perovskite/silicon multijunction solar cell enabled by a silicon tunnel junction. Appl. Phys. Lett. 106, 121105 (2015).

Albrecht, S. et al. Monolithic perovskite/silicon-heterojunction tandem solar cells processed at low temperature. Energy Environ. Sci. 9, 81-88 (2016).

Jiang, F. et al. A two-terminal perovskite/perovskite tandem solar cell. J. Mater. Chem. A 4, 1208-1213 (2016).

Forgacs, D. et al. Efficient Monolithic Perovskite/Perovskite Tandem Solar Cells. Adv. Energy Mater., 1602121 (2017).

Ergen, O. et al. "Hexagonal boron nitride as a cationic diffusion barrier to form a graded band gap perovskite heterostructure," Phys. Status Solidi B 253, No. 12 (2016).

* cited by examiner

GRADED BANDGAP PEROVSKITE SOLAR CELL

RELATED APPLICATIONS

This application claims priority to U.S. Provisional Patent Application Ser. No. 62/305,933, filed Mar. 9, 2016, which is hereby incorporated by reference.

STATEMENT OF GOVERNMENT SUPPORT

This invention was made with government support under Contract No. DE-AC02-05CH11231 awarded by the U.S. Department of Energy, under Grant No. 1542741 awarded by the National Science Foundation, and under Grant No. N00014-16-1-2229 awarded by the Office of Naval Research (MURI). The government has certain rights in this invention.

TECHNICAL FIELD

This disclosure relates generally to solar cells and more particularly to perovskite solar cells.

BACKGROUND

Organic-inorganic perovskite solar cells are typically prepared in a single bandgap configuration, where an absorber layer ($ABX_3$, $A=CH_3NH_3(MA)$; B=Pb, Sn; and X=Cl, Br, I) is sandwiched between an electron transport layer (ETL) and a hole transport layer (HTL). Following significant effort in optimizing interface layers to control the carrier dynamics, power conversion efficiencies (PCEs) for this design, for a single cell, have surpassed 20%. In addition, due to the toxicity of lead in the absorber layer, lead-free tin halide perovskite solar cells have gained tremendous importance. However, lead-free cells do not exhibit such high photovoltaic performances (e.g., less than 7%) due to chemical instability.

The tunable bandgap of methylammonium-lead-halide has also led researchers to construct multijunction tandem cells which aim to maximize the solar irradiative spectrum. In these tandem cells, the perovskite layer can be integrated with crystalline silicon (c-Si) and copper indium gallium selenide (CIGS). However, the tandem cell requires complex electrical coupling and interconnection between the perovskite sub-cells, which generates electron-hole recombination centers.

SUMMARY

One innovative aspect of the subject matter described in this disclosure can be implemented in a solar cell including a first electrode, a hole transport layer disposed on the first electrode, a first perovskite layer disposed on the hole transport layer, a cationic diffusion barrier disposed on the first perovskite layer, a second perovskite layer disposed on the cationic diffusion barrier, an electron transport layer disposed on the second perovskite layer, and a second electrode disposed on the electron transport layer. The first perovskite layer comprises a different perovskite than the second perovskite layer.

In some implementations, the cationic diffusion barrier comprises a material selected from a group consisting of hexagonal boron nitride, graphene oxide, fluorinated graphene, graphane, germanate, a dichalcogenide, a two-dimensional carbide or nitride, silicene, a topological insulator, a two-dimensional polymer, and a metal organic framework. In some implementations, the hole transport layer comprises a hole transport material and a carbon structure disposed therein. In some implementations, the carbon structure is selected from a group consisting of a graphene aerogel, a plurality of graphene flakes, and a plurality of carbon nanotubes.

Another innovative aspect of the subject matter described in this disclosure can be implemented in a solar cell including a layer of gold, a layer of spiro-OMeTAD having a graphene aerogel disposed therein disposed on the layer of gold, a layer of $CH_3NH_3PbI_{3-x}Br_x$ disposed on the layer of spiro-OMeTAD, a monolayer of hexagonal boron nitride disposed on the layer of $CH_3NH_3PbI_{3-x}Br_x$, a layer of $CH_3NH_3SnI_3$ disposed on the monolayer of hexagonal boron nitride, a layer of gallium nitride disposed the layer of $CH_3NH_3SnI_3$, and an electrode comprising an alloy of titanium, aluminum, nickel, and gold disposed on layer of gallium nitride.

Another innovative aspect of the subject matter described in this disclosure can be implemented in a solar cell including a first electrode, a hole transport layer disposed on the first electrode, a perovskite layer disposed on the hole transport layer, an electron transport layer disposed on the perovskite layer, and a second electrode on the electron transport layer. The hole transport layer comprises a hole transport material and a carbon structure disposed in the hole transport material.

In some implementations, the carbon structure is selected from a group consisting of a graphene aerogel, a plurality of graphene flakes, and a plurality of carbon nanotubes. In some implementations, the carbon structure is doped.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 90% of the targeted value, within 95% of the targeted value, or within 99% of the targeted value.

In spite of numerous proposals for bandgap engineering of perovskite layers by replacing the metal cations, varying the composition of halide ions, or altering the moisture content, only one report has emerged of a successful perovskite/perovskite two-terminal tandem cell, with a PCE of 7%. An appealing alternative is the perovskite-based graded bandgap solar cell, for which, in principle, the electron-hole collection efficiency can be enhanced considerably, resulting in an acceptable open-circuit output voltage and a very large output current. In contrast to tandem cells, complex interconnections and current coupling are not needed in this architecture. Despite these advantages, a functioning perovskite-based graded bandgap solar cell has proved elusive, probably due to excessive cation mixing.

Figure 1:
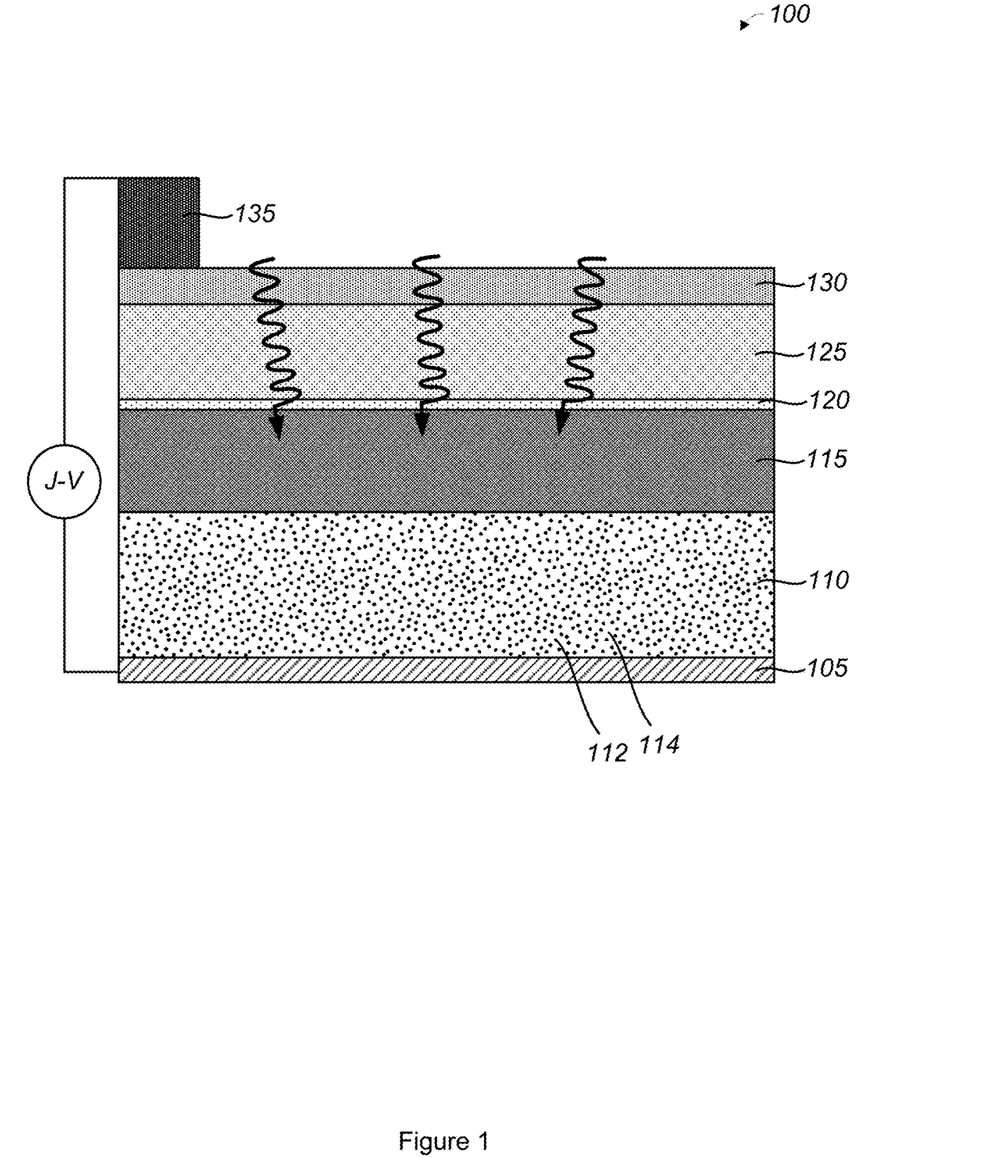
FIG. 1 shows an example of a cross-sectional schematic illustration of a graded bandgap perovskite solar cell.

FIG. 1 shows an example of a cross-sectional schematic illustration of a graded bandgap perovskite solar cell. The graded bandgap perovskite solar cell 100 shown in FIG. 1 includes a first electrode 105, a hole transport layer 110 disposed on the first electrode 105, a first perovskite layer 115 disposed on the hole transport layer 110, a cationic diffusion barrier 120 disposed on the first perovskite layer 115, a second perovskite layer 125 disposed on the cationic diffusion barrier 120, an electron transport layer 130 disposed on the second perovskite layer 125, and a second electrode 135 disposed on the electron transport layer 130.

In some embodiments, the first electrode 105 comprises a layer of a metal. In some embodiments, the first electrode 105 comprises a layer of a material selected from a group consisting of aluminum, silver, gold, platinum, a titanium chromium alloy, fluorinated tin oxide (FTO), graphite, and conducting polythiophene polymers. In some embodiments, the first electrode is about 5 nanometers (nm) to 100 nm thick, or about 75 nm thick. In some embodiments, the surface area of the first electrode 105 is smaller than the area of the hole transport layer 110 so that the first electrode 105 does not completely cover the hole transport layer 110. That is, in some embodiments, the first electrode 105 is disposed on a portion of the hole transport layer 110.

In some embodiments, the hole transport layer 110 comprises a hole transport material 114. In some embodiments, the hole transport layer 110 comprises a hole transport material 114 selected from a group consisting of spiro-OMeTAD, poly(3-hexylthiophene-2,5-diyl) (P3HT), cuprous oxide ($Cu_2O$), copper iodide (CuI), cuprous thiocyanate (CuSCN), carbazole, copper phthalocyanine, and copper doped nickel oxide. In some embodiments, the hole transport layer 110 is about 50 nm to 500 nm thick, or about 300 nm to 400 nm thick.

In some embodiments, a carbon structure 112 is disposed in the hole transport material 114. In some embodiments, the hole transport material 114 is disposed on the carbon structure 112. In some embodiments, the carbon structure 112 is selected from a group consisting of a graphene aerogel and a plurality of carbon nanostructures (e.g., a plurality of graphene flakes or a plurality of carbon nanotubes). In some embodiments, the carbon structure 112 has a high surface area.

When the carbon structure 112 comprises a graphene aerogel, the graphene aerogel may have a density of about $1.1 \times 10^{-3}$ grams per centimeter cubed ($g/cm^3$) to 2.27 $g/cm^3$, a surface area of about 100 $m^2/g$ to 2630 $m^2/g$ (i.e., the density of graphene) or about 100 $m^2/g$ to 1200 $m^2/g$, and an electrical conductivity of about 0.1 S/m to 100 S/m. In some embodiments, the graphene aerogel comprises a single piece of a graphene aerogel. In some embodiments, the graphene aerogel comprises a plurality of pieces of a graphene aerogel.

In some embodiments, the carbon structure 112 comprises a volume fraction of the hole transport layer 110. For example, when the carbon structure 112 comprises a plurality of carbon nanostructures, the plurality of carbon nanostructures may be dispersed throughout the hole transport material 114. In some embodiments, the carbon structure comprises a sheet of material formed from a plurality of carbon nanotubes (i.e., buckypaper).

In some embodiments, the carbon structure 112 increases charge collection in the hole transfer material (i.e., the carbon structure increase the charge collection efficiency). In some embodiments, the carbon structure 112 is doped. In some embodiments, the carbon structure is doped with nitrogen or boron.

In some embodiments, the carbon structure 112 is hydrophobic. In some embodiments, the carbon structure 112 reduces or prevents water from entering to the first perovskite layer 115 and/or the second perovskite layer 125. In some embodiments, the carbon structure 112 affects the morphology (e.g., grain size) of the hole transport material 114. The carbon structure 112 can affect the morphology of the hole transport material 114 when the hole transport material crystallizes or is otherwise formed on or with the carbon structure 112.

In some embodiments, the first perovskite layer 115 comprises an organic-inorganic halide perovskite. For example, in some embodiments, the first perovskite layer 115 comprises $CH_3NH_3PbI_{3-x}Br_x$. The bandgap of a first perovskite 115 layer comprising $CH_3NH_3PbI_{3-x}Br_x$ may be about 1.5 eV to 2.2 eV. In some embodiments, the first perovskite layer 115 is about 30 nm to 200 nm thick, or about 150 nm to 200 nm thick.

In some embodiments, the cationic diffusion barrier 120 serves to prevent or to reduce the diffusion of a first cation of the first perovskite layer 115 into the second perovskite layer 125. In some embodiments, the cationic diffusion barrier 120 serves to prevent or to reduce the diffusion of a second cation of the second perovskite layer 125 into the first perovskite layer 115. In some embodiments, the cationic diffusion barrier 120 serves to promote or to increase the adhesion of the first perovskite layer 115 to the second perovskite layer 125. In some embodiments, the cationic diffusion barrier 120 allows for charge tunneling (e.g., tunneling of electrons) through the barrier.

The cationic diffusion barrier 120 may comprise a number of different materials. In some embodiments, the cationic diffusion barrier 120 is selected from a group consisting of hexagonal boron nitride (h-BN), graphene oxide, fluorinated graphene, graphane (i.e., a two-dimensional polymer of carbon and hydrogen with the formula unit $(CH)_n$), germinate, a dichalcogenide, a transition metal dichalcogenide (e.g., $MX_2$ (M: Hf, Mo, or W and X: S, Se, or Te, such as MoS2, $WS_2$, $MoSe_2$, $MoTe_2$, $HfS_2$), two-dimensional carbides and nitrides (MXenes), silicene, topological insulators (e.g., stanine and BICN), two-dimensional polymers, and metal organic frameworks (MOFs). In some embodiments, the cationic diffusion barrier 120 consists of a monolayer of a material. In some embodiments, the cationic diffusion barrier 120 comprises a plurality of monolayers of a material (e.g., two to three monolayers of a material).

In some embodiments, the cationic diffusion barrier 120 comprises h-BN. In some embodiments, the cationic diffusion barrier 120 consists of a monolayer of h-BN. In some embodiments, the cationic diffusion barrier 120 comprises a plurality of monolayers of h-BN (e.g., two to three monolayers of h-BN).

In some embodiments, the second perovskite layer 125 comprises a different perovskite than the first perovskite layer 115. In some embodiments, the second perovskite layer 125 comprises an organic-inorganic halide perovskite. In some embodiments, the second perovskite layer 125 has a different bandgap than the first perovskite layer 115. For example, in some embodiments, the first perovskite layer 115 may absorb a shorter wavelength of light compared to the second perovskite layer 125. For example, in some embodiments, the second perovskite layer 125 comprises $CH_3NH_3SnI_3$. The bandgap of a second perovskite layer 125 comprising $CH_3NH_3SnI_3$ may be about 1.2 eV to 1.5 eV. In some embodiments, the second perovskite layer 125 comprises $CH_3NH_3Sn(I_{3-x})Br_x$. In some embodiments, the second perovskite layer 125 is about 30 nm to 200 nm thick, or about 150 nm to 200 nm thick.

In some embodiments, a concentration of a first halide of the first perovskite layer 115 decreases from the first perovskite layer 115 to the second perovskite layer 125. For example, from a point near the hole transport layer 105, the concentration of a first halide decreases in a line scan as one travels through the first perovskite layer 115, across the cationic diffusion barrier 120, and through the second perovskite layer 125. In some embodiments, the concentration decreases in a linear manner or a substantially linear manner.

In some embodiments, a concentration of a second halide of second perovskite layer 125 decreases from the second perovskite layer 125 to the first perovskite layer 115. For example, from a point near the electron transport layer 130, the concentration of a second halide decreases in a line scan as one travels through the second perovskite layer 125, across the cationic diffusion barrier 120, and through the first perovskite layer 115. In some embodiments, the concentration decreases in a linear or a substantially linear fashion. In some embodiments, the varying concentrations of the first halide and the second halide from the first perovskite layer 115 and the second perovskite layer 125 across the cationic diffusion barrier 125 is due to diffusion of the first halide and the second halide across the cationic diffusion barrier 120.

In some embodiments, the first perovskite layer 115 and the second perovskite layer 125 comprise two different $ABX_3$ perovskite materials (for example, where A is cesium (Cs), methylammonium (MA—$CH_3NH_3$), or formamidinium (FA—$CH_3(NH_2)_2$), where B is lead (Pb) or tin (Sn), and where X is a halide such as chlorine (Cl), bromine (Br), or iodine (I)) having different bandgaps. For example, in some embodiments, the first perovskite layer 115 and the second perovskite layer 125 comprise two different organic-inorganic perovskite materials having different cations (i.e., the B species in $ABX_3$ organic-inorganic halide perovskite materials). In some embodiments, the first perovskite layer 115 and the second perovskite layer 125 comprise two different organic-inorganic perovskite materials having different halides (i.e., the X species in $ABX_3$ organic-inorganic halide perovskite materials).

In some embodiments, the bandgap in each of the first perovskite layer 115 and the second perovskite layer 125 varies. For example, the bandgap of the second perovskite layer 125 may be low at or proximate the electron transport material 130 and increase in the second perovskite layer to the cationic diffusion barrier 120. In some embodiments, the bandgap in the second perovskite layer 125 increases linearly or substantially linearly through the thickness of the second perovskite layer 125. Similarly, the bandgap of the first perovskite layer 115 may be low at or proximate the cationic diffusion barrier 120 and increase in the first perovskite layer to the hole transport layer 110. In some embodiments, the bandgap in the first perovskite layer 115 increases linearly or substantially linearly through the thickness of the first perovskite layer 115.

In some embodiments, the graded bandgap perovskite solar cell has a bandgap in the perovskite layers that varies from about 1 eV to 3 eV or about 1.2 eV to 2.2 eV. For example, in the graded bandgap perovskite solar cell 100, the bandgap in the second perovskite layer 125 may vary from about 1 eV to 1.5 eV or about 1.2 eV to 1.5 eV. The bandgap in the first perovskite 115 layer may vary from about 1.5 eV to 3 eV or about 1.5 eV to 2.2 eV.

In some embodiments, the electron transport layer 130 comprises a material selected from a group consisting of gallium nitride, titanium dioxide, aluminum oxide, and silicon carbide. In some embodiments, the electron transport layer 130 is doped. For example, in some embodiments, when the electron transport layer comprises gallium nitride, the gallium nitride is doped with silicon, oxygen, or germanium. In some embodiments, the gallium nitride is doped at a level higher than about $1\times10^{19}$ atoms per centimeter cubed (atoms/$cm^3$).

In some embodiments, there is strain in the second perovskite layer 125 at the interface of the second perovskite layer 125 and the electron transport layer 130. A strain may exist here due to the electron transport layer 130 having different lattice constants than the second perovskite layer 125. In some embodiments, strain in the second perovskite layer 125 reduces the bandgap in at least a portion of the second perovskite layer 125.

In some embodiments, the second electrode 135 comprises a layer of a metal. In some embodiments, the second electrode 135 comprises a layer of a material selected from a group consisting of aluminum, silver, gold, platinum, a titanium chromium alloy, fluorinated tin oxide (FTO), graphite, and conducting polythiophene polymers. In some embodiments, the second electrode 135 comprises an alloy of titanium, aluminum, nickel, and gold. In some embodiments, the second electrode 135 is about 5 nm to 450 nm thick, or about 300 nm thick. In some embodiments, the surface area of the second electrode 135 is smaller than the area of the electron transport layer 130 so that the second electrode 135 does not completely cover the electron transport layer 130. In some embodiments, the first electrode 105 is in electrical contact with the second electrode 135.

As shown in FIG. 1, the graded bandgap perovskite solar cell 100 is illuminated by light being transmitted through the electron transport layer 130. In some embodiments, when the hole transport layer 110 and the first electrode 105 are transparent or substantially transparent to wavelengths of light that are absorbed by the first perovskite layer 115 and the second perovskite layer 125, the graded band perovskite gap solar cell 100 may be illuminated by light being transmitted through the hole transport layer 110 and the first electrode 105.

In some embodiments, the graded bandgap solar cell architecture of the solar cell 100 shown in FIG. 1 uses semiconducting materials other than perovskites. For example, in some embodiments, a first material and a second material may be separated by a cationic diffusion barrier, where the first material and the second material comprise copper indium gallium (di)selenide (CIGS) materials or other semiconducting materials (e.g., cadmium sulfide (CdS) or cadmium telluride (CdTe)) having different bandgaps.

Figure 2:
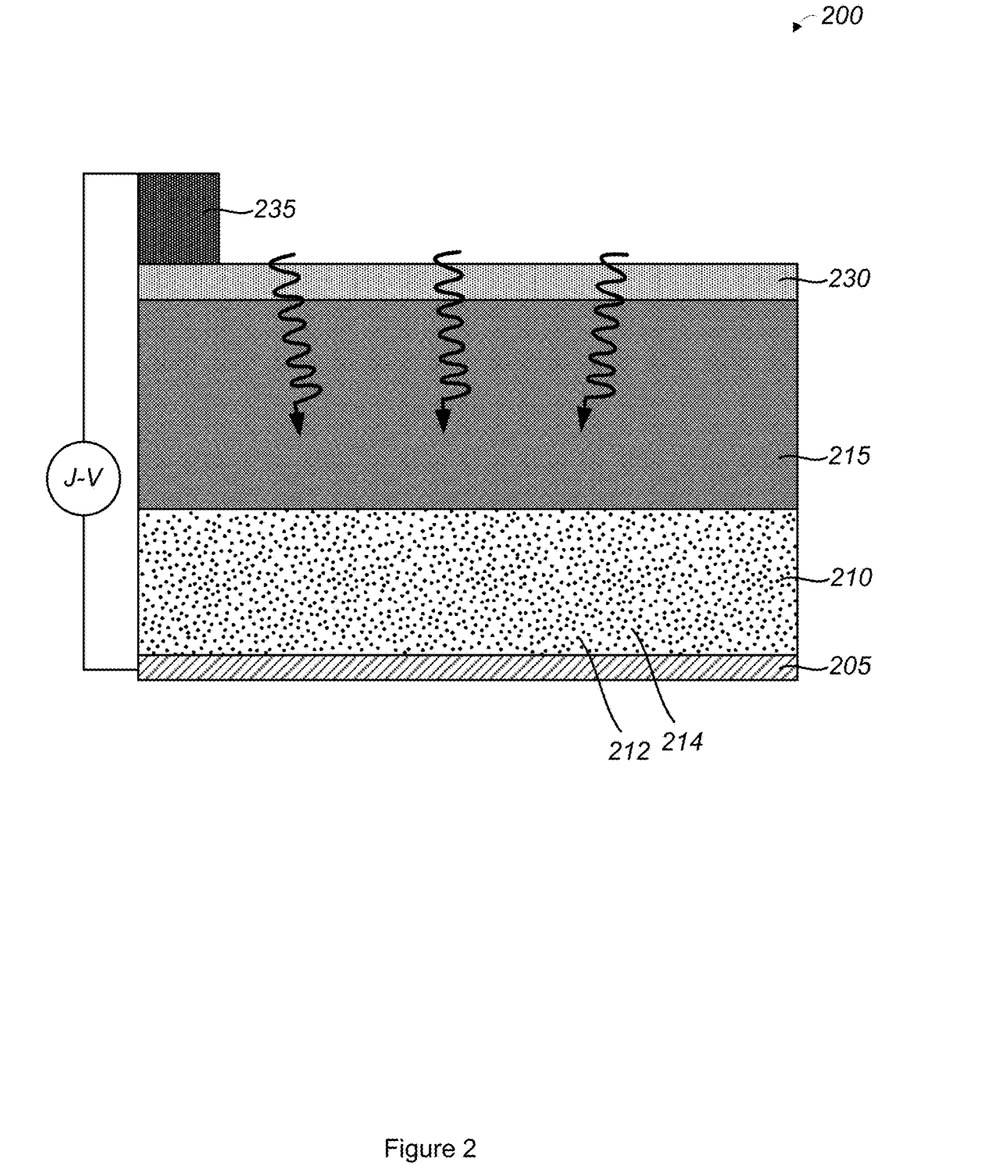
FIG. 2 shows an example of a cross-sectional schematic illustration of a perovskite solar cell.

A graded bad gap solar cell may include more than one cationic diffusion barrier. For example, in some embodiments, a graded bad gap solar cell includes an additional perovskite layer and an additional cationic diffusion barrier. For example, a second cationic diffusion barrier may be disposed on the second perovskite layer 125 (as shown in FIG. 2), with a third perovskite layer disposed on the second cationic diffusion barrier and the electron transport layer disposed on the third perovskite layer. In some embodiments, the first, second, and third perovskite layers are different perovskite materials having different bandgaps.

FIG. 2 shows an example of a cross-sectional schematic illustration of a perovskite solar cell. The perovskite solar cell 200 shown in FIG. 2 includes a first electrode 205, a hole transport layer 210 disposed on the first electrode 205, a perovskite layer 215 disposed on the hole transport layer 210, an electron transport layer 230 disposed on the perovskite layer 215, and a second electrode 235 disposed on the electron transport layer 230. The hole transport layer 210 comprises a hole transport material 214 and a carbon structure 212 disposed in the hole transport material 214. In some embodiments, the materials used in the perovskite solar cell 200 are the same or similar to the materials used in the graded bandgap solar cell 100 shown in FIG. 1.

For example, in some embodiments, the hole transport material 214 of the hole transport layer 210 comprises a material selected from a group consisting of spiro-OMeTAD, poly(3-hexylthiophene-2,5-diyl) ($P_3HT$), cuprous oxide ($Cu_2O$), copper iodide (CuI), cuprous thiocyanate (CuSCN), carbazole, copper phthalocyanine, and copper doped nickel oxide. In some embodiments, the hole transport layer 210 is about 50 nm to 500 nm thick, or about 300 nm to 400 nm thick.

In some embodiments, a carbon structure 212 is disposed in the hole transport material 214. In some embodiments, the hole transport material 214 is disposed on the carbon structure 212. In some embodiments, the carbon structure 212 is selected from a group consisting of a graphene aerogel and a plurality of carbon nanostructures (e.g., a plurality of graphene flakes or a plurality of carbon nanotubes). In some embodiments, the carbon structure 212 has a high surface area.

When the carbon structure 212 comprises a graphene aerogel, the graphene aerogel may have a density of about $1.1 \times 10^{-3}$ grams per centimeter cubed ($g/cm^3$) to 2.27 $g/cm^3$, a surface area of about 100 $m^2/g$ to 2630 $m^2/g$ (i.e., the density of graphene) or about 100 $m^2/g$ to 1200 $m^2/g$, and an electrical conductivity of about 0.1 S/m to 100 S/m. In some embodiments, the graphene aerogel comprises a single piece of a graphene aerogel. In some embodiments, the graphene aerogel comprises a plurality of pieces of a graphene aerogel.

In some embodiments, the carbon structure 212 comprises a volume fraction of the hole transport layer 210. For example, when the carbon structure 212 comprises a plurality of carbon nanostructures, the plurality of carbon nanostructures may be dispersed throughout the hole transport material 214. In some embodiments, the carbon structure comprises a sheet of material formed from a plurality of carbon nanotubes (i.e., buckypaper).

In some embodiments, the carbon structure 212 increases charge collection in the hole transfer material (i.e., the carbon structure increase the charge collection efficiency). In some embodiments, the carbon structure 212 is doped. In some embodiments, the carbon structure is doped with nitrogen or boron.

In some embodiments, the carbon structure 212 is hydrophobic. In some embodiments, the carbon structure 212 reduces or prevents water from entering to the perovskite layer 215. In some embodiments, the carbon structure 212 affects the morphology (e.g., grain size) of the hole transport material 214. The carbon structure 212 can affect the morphology of the hole transport material 214 when the hole transport material crystallizes or is otherwise formed on or with the carbon structure 212.

As shown in FIG. 2, the perovskite solar cell 200 is illuminated by light being transmitted through the electron transport layer 230. In some embodiments, when the hole transport layer 210 and the first electrode 205 are transparent or substantially transparent to wavelengths of light that are absorbed by the perovskite layer 215, the perovskite solar cell 200 may be illuminated by light being transmitted through the hole transport layer 210 and the first electrode 205.

Figure 3:
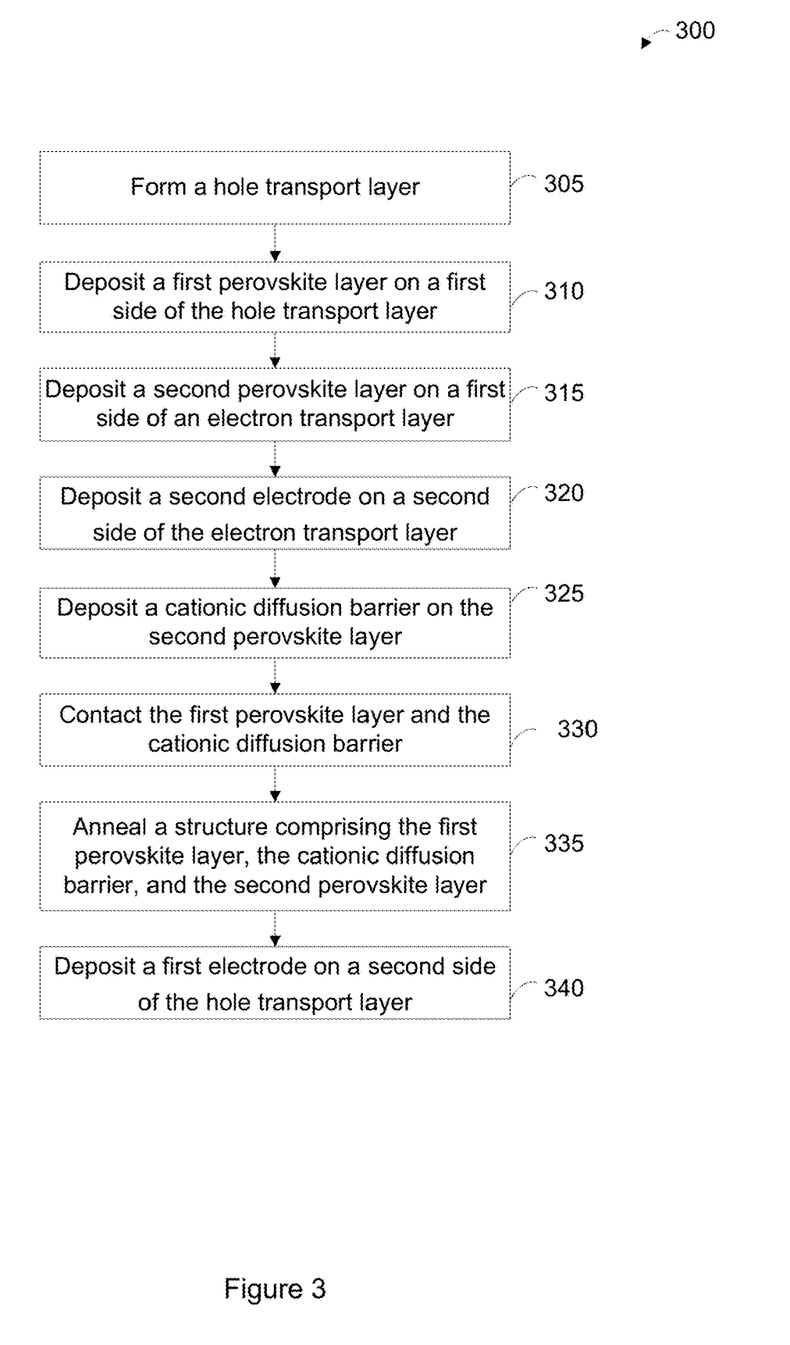
FIG. 3 shows an example of a flow diagram illustrating a manufacturing process for a graded bandgap perovskite solar cell.

FIG. 3 shows an example of a flow diagram illustrating a manufacturing process for a graded bandgap perovskite solar cell. The method 300 shown in FIG. 3 may be performed using the materials of described above with respect to the graded bandgap solar cell 100 shown in FIG. 1. At block 305 of the method 300 shown in FIG. 3, a hole transport layer is formed. In some embodiments, the hole transport layer consists of or comprises a hole transport material. In some embodiments, the hole transport layer comprises a hole transport material and a carbon structure disposed therein.

In some embodiments, the hole transport material is formed on a substrate. For example, the hole transport material may be deposited on the substrate using a spin-coating process. In some embodiments, a carbon structure (e.g., a plurality of graphene flakes or a plurality of carbon nanotubes) are dispersed in the hole transport material before depositing the hole transport material on the substrate. In some embodiments, a hole transport material is deposited on a graphene aerogel or bucky paper.

At block 310, a first perovskite layer is deposited on the first side of the hole transport layer. In some embodiments, the first perovskite layer is deposited on the first side of the hole transport layer using a solution-based process, such as a spin-coating process.

At block 315, a second perovskite layer is deposited on a first side of an electron transport layer. In some embodiments, the second perovskite layer is deposited on a first side of the electron transport layer using a solution-based process, such as a spin-coating process.

At block 320, a second electrode is deposited on a second side of the electron transport layer. In some embodiments, a physical vapor deposition process in used to deposit the second electrode on the second side on the electron transport layer. Patterning techniques, including masking as well as etching processes, may be used to define the shape of the second electrode on the second side of the electron transport layer.

At block 325, a cationic diffusion barrier is deposited on the second perovskite layer. In some embodiments, the cationic diffusion barrier is deposited on the second perovskite layer using a physical vapor deposit process or a chemical vapor deposition process. In some embodiments, the cationic diffusion barrier is formed as a layer of a material and then transferred onto the second perovskite layer.

At block 330, the first perovskite layer is contacted with the cationic diffusion barrier. After block 330, a structure similar to the graded bandgap perovskite solar cell 100 shown in FIG. 1 may be formed. In some embodiments, the structure includes a first perovskite layer, a cationic diffusion barrier, and a second perovskite layer.

At block 335, the structure is thermally annealed. In some embodiments, the structure is annealed at about 40° C. to 120° C., or about 80° C., for about 5 minutes to 30 minutes, or about 15 minutes. Thermally annealing the structure serves in part to cure and/or crystallize the first perovskite layer and the second perovskite layer. In some embodiments, thermally annealing the structure serves to promote halide diffusion across the cationic diffusion barrier, forming the property of the graded bandgap in the first perovskite layer and the second perovskite layer.

At block 340, a first electrode is deposited on a second side of a hole transport layer. In some embodiments, a physical vapor deposition process is used to deposit the first electrode on the second side on the hole transport layer. Patterning techniques, including masking as well as etching processes, may be used to define the shape of the first electrode on the second side of the hole transport layer.

In some embodiments, operations in the method 300 shown in FIG. 3 are used to fabricate the perovskite solar cell 200 shown in FIG. 2. When fabricating the perovskite solar cell 200 shown in FIG. 2, no cationic diffusion barrier is used and only one perovskite layer is deposited.

For example, a process to fabricate a perovskite solar cell may include: (1) depositing a perovskite layer on a first side of an electron transport layer; (2) depositing a second electrode on a second side of the electron transport layer; (3) deposing a hole transport layer including a carbon structure on the perovskite layer; and (4) depositing a first electrode on the hole transport layer.

Another process to fabricate a perovskite solar cell may include: (1) depositing a hole transport layer including a carbon structure on a first electrode; (2) depositing a perovskite layer on the hole transport layer; (3) depositing an electron transport layer on the perovskite layer; and (4) depositing a second electrode on the electron transport layer.

EXAMPLES

The following examples are intended to be examples of the embodiments disclosed herein, and are not intended to be limiting. Experiments were performed to determine the effect of the cationic diffusion barrier on cation diffusion in two different organic-inorganic halide perovskites and the effect of carbon structures disposed in the hole transport material.

The following method was used to fabricate the graded bandgap perovskite solar cells used in the experiments to measure the properties a graded bandgap perovskite solar cell. Commercial GaN on a silicon (Si) wafer was annealed at 650° C. for 2 hours in an argon (Ar) environment. The backside of the wafer (silicon surface) was mechanically polished by diamond paste until the silicon layer was thin. This thin layer was photolithographically masked by a silicon nitride ($Si_3N_4$) film and etched entirely by 45 weight percent (wt. %) potassium hydroxide (KOH) at 110° C. for 14 hours. Then, a Ti/Al/Ni/Au (30 nm/100 nm/20 nm/150 nm) stack layer was deposited by e-beam lithography and e-beam evaporation, followed by rapid thermal annealing at 850° C. The GaN surface was briefly plasma etched to help evenly disperse the perovskite solution. Next, $CH_3NH_3SnI_3$ was spin coated at 4,000 r.p.m. for 45 seconds and crystallized at 80° C. Afterwards, a monolayer of h-BN was transferred directly onto the prepared substrate.

The hole transfer material (HTM) was deposited on a graphene aerogel (GA) by spin-coating at 2,000 r.p.m. for 30 seconds and then left at room temperature for 5 minutes. Subsequently, $CH_3NH_3PbI_{3-x}Br_x$ was spin coated on this GA/HTM layer at 3,000 r.p.m. for 30 seconds and the film crystallized at 60° C. This second layer was gently placed onto the first layer, in the glove box, and annealed at 60° C. Finally, a 75 nm thick gold (Au) electrode was evaporated on top of the HTM/GA layer.

The GA sheets were prepared by the gelation of a graphene oxide (GO) suspension. The aqueous GO suspension (2 wt. %) was prepared by ultrasonication. In a glass vial, 3 ml of the GO suspension was mixed with 500 microliter (µl) of concentrated $NH_4OH$ (28% to 30%). The vial was sealed and placed in an oven at 80° C. overnight. The resulting wet gel was washed in deionized water to purge $NH_4OH$, followed by an exchange of water with acetone inside the pores. The washed gel then underwent supercritical drying by using $CO_2$ and was converted to the final graphene aerogels by pyrolysis at 1,050° C. under nitrogen flow.

Figure 4A:
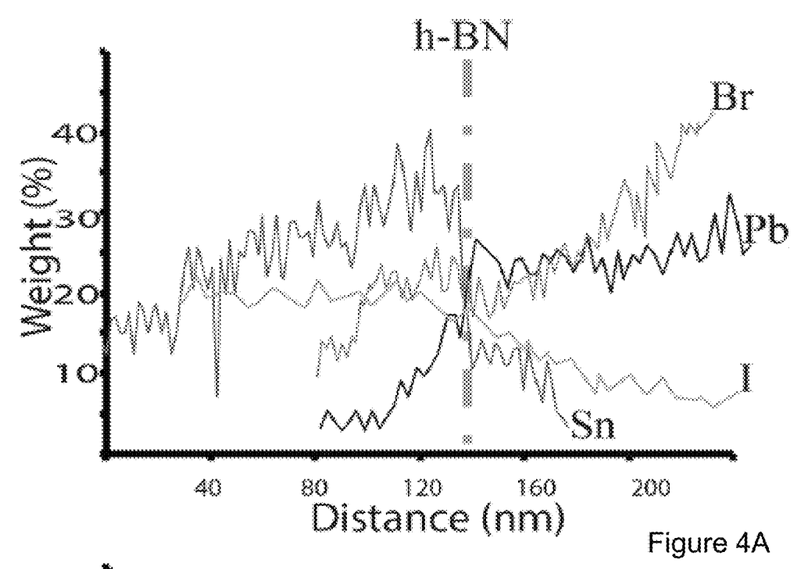
FIGS. 4A and 4B show examples of cross-sectional line mapping of energy dispersive X-ray spectroscopy (EDAX) of double layers with and without h-BN of a graded bandgap heterostructure.
Figure 4B:
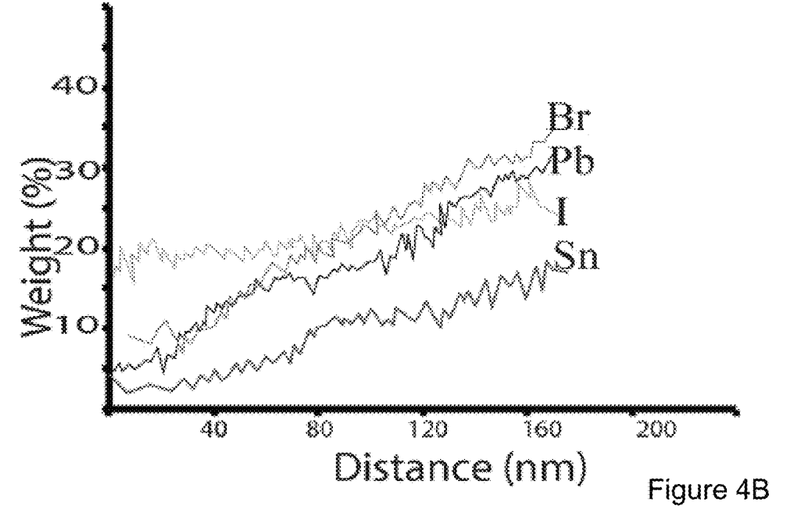

FIGS. 4A and 4B show examples of cross-sectional line mapping of energy dispersive X-ray spectroscopy (EDAX) of double layers with and without h-BN of a graded bandgap perovskite heterostructure. The graded bandgap perovskite heterostructure was fabricated by first growing monolayer and multilayer h-BN by chemical vapor deposition (CVD) on a copper (Cu) surface. The metal grown substrate was etched away and the h-BN layer was released onto the etchant solution surface. Afterwards, the released h-BN layer was picked up and placed into a perovskite solution, $CH_3NH_3SnI_3$. Next, the h-BN layer with solution was dropped onto a glass substrate and spin coated at 1500 rpm, in a glove box, to remove excess perovskite solution underneath the h-BN layer. Then, the second perovskite layer, $CH_3NH_3PbI_{3-x}Br_x$, was spin coated at 3000 rpm onto the h-BN layer. Finally, the sample was annealed at 60° C. for 15 min.

The EDAX line scans show steep concentration gradients of Sn and Pb at the h-BN interface (FIG. 4A) while iodide (I) and bromide (Br) concentrations gradually decrease and increase, respectively. I and Br are more likely to diffuse thorough the h-BN layer than Pb and Sn. This line mapping demonstrates the role of h-BN as a cationic diffusion barrier to prevent undesired cation mixing. The line mapping also shows that h-BN controls the variation of iodide and bromide concentrations.

The perovskite layers without h-BN (FIG. 4B) display an upward trend for cation and halide ion distributions. Moreover, there is no steep gradient feature at any Sn and Pb fraction. The line mappings indicate Sn, Pb, I, and Br are mixing along the sample.

Experiments were also performed to measure the properties a graded bandgap perovskite solar cell. High-efficiency graded bandgap perovskite solar cells with very large current outputs were first fabricated as described above. Briefly, mixed halide double-layer perovskite devices were fabricated (layer 1: $CH_3NH_3SnI_3$ and layer 2: $CH_3NH_3PbI_{3-x}Br_x$) in order to create a graded bandgap. Perovskite layers were deposited on a heavily doped gallium nitride (GaN) substrate, which in turn served as an electron injection layer. A monolayer of hexagonal boron nitride (h-BN) was used as a cationic diffusion barrier and adhesion promoter between these two layers, in addition to its excellent electron tunneling properties. Moreover, the carrier transport properties in the spiro-OMeTAD based HTL were manipulated by incorporating a graphene aerogel (GA). The architecture was robust and the cells reliably produced very large current densities up to 45 mA cm$^{-2}$, with average PCEs of 18.41%, with the highest steady-state PCE topping 21.7% (freshly illuminated cells display PCEs of nearly 26%).

Figure 5:
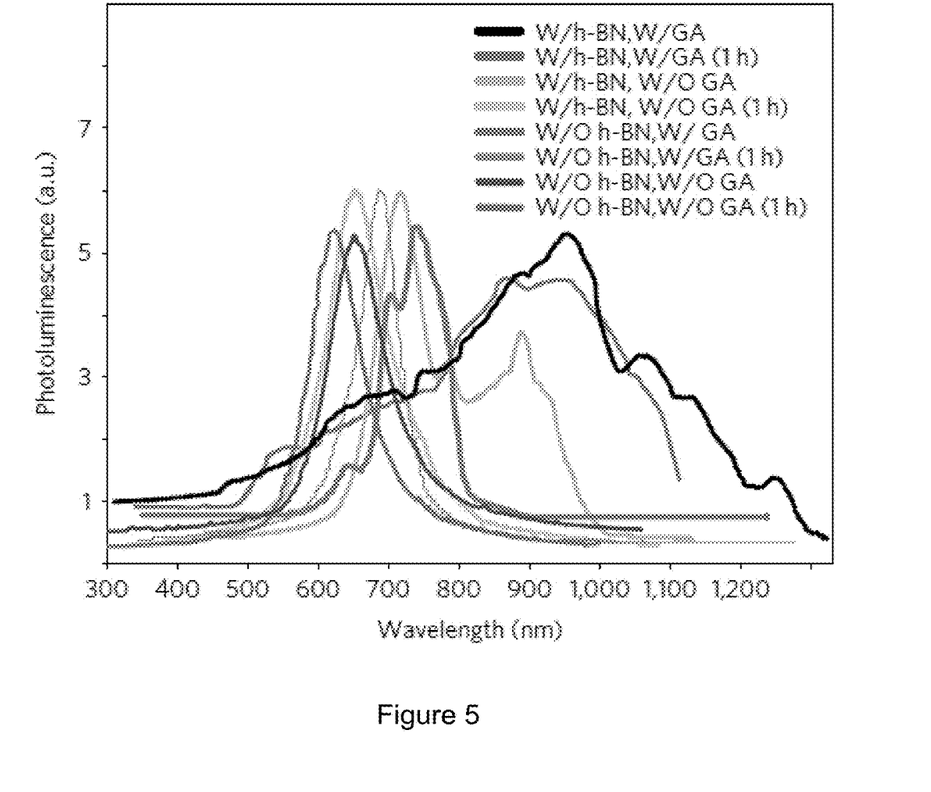
FIG. 5 shows examples of photoluminescence (PL) spectra of perovskite cells with (W/) and without (W/O) monolayer h-BN or graphene aerogel (GA) components. The spectra shown in FIG. 5 were recorded in the steady-state regime after a few minutes of constant illumination, or after one hour (1 h) of constant illumination.

FIG. 5 shows examples of photoluminescence (PL) spectra of typical devices and their performances under constant illumination. Cells with h-BN and GA show significant stability over time. Cells without GA but with the h-BN layer exhibit brief graded bandgap formation and moderate degradation afterwards. Cells without h-BN exhibit no graded bandgap formation.

Photocurrent generation for a complete device (with h-BN and GA modifications) begins in the range from ~600 nm to ~1,300 nm. The presence of broad and multiple peaks implies the formation of a graded bandgap. Using Sn as an active metal cation in the first perovskite layer provides a narrow bandgap in the 1.2 eV to 1.5 eV range. However, Sn-containing semiconductors can be strain sensitive, which can cause further narrowing of the bandgap. The strain at the GaN/perovskite interface can result in significant energy bandgap shifts due to splitting of valence band degeneracy, which leads to the lowest bandgap of the device, around 1 eV, and results in an enhanced photocurrent generation up to 1,250 nm. Replacing Sn with Pb in the second layer facilitates a larger bandgap between 1.5 eV to 2.2 eV by varying halide composition. The experimental evidence of this effect is also shown in the absorption and steady-state photoluminescence spectra (not shown). An energy dispersive X-ray spectroscopy (EDAX) line scan analysis also shows characteristic features of cationic diffusion and confirms the variation in iodide concentration (not shown).

Figure 6A:
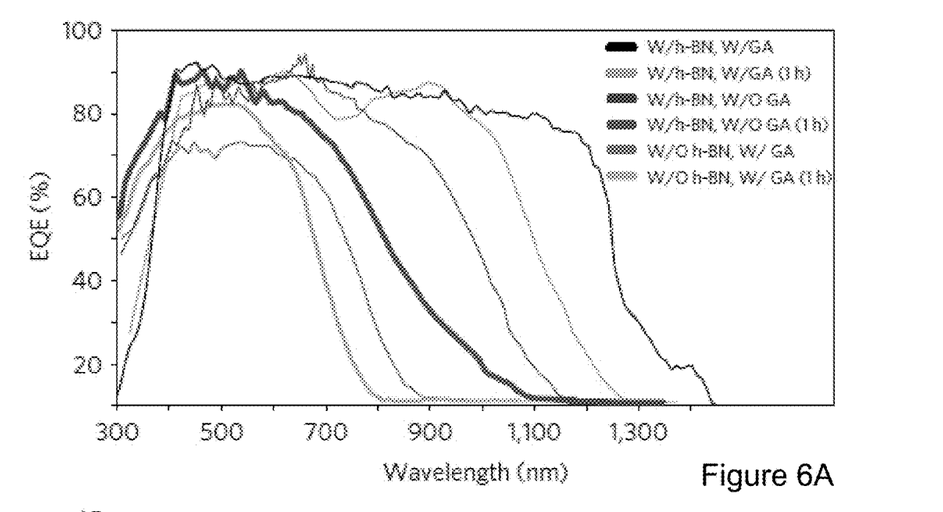
FIGS. 6A and 6B show examples of the response characteristic of perovskite cells, with and without h-BN and graphene aerogel.

FIG. 6A shows external quantum efficiency (EQE) measurements for devices with and without GA and h-BN modifications. The data show significant differences in spectral response. For samples with h-BN and GA, the response extends up to ~1,400 nm (increasing the theoretical short-circuit limit to 50 mA cm$^{-2}$). The long-wavelength absorption, higher than 1,250 nm, arises due to an extra PL peak in the near-infrared region (NIR) which appears only under constant illumination. This light-induced peak forms at ~1,300 nm and broadens with increased light intensity. This peak can be attributed to two main effects: a possible defect-induced lattice absorption or a free-carrier accumulation which results in charge screening at the band edges; thus, the bandgap is further reduced. This bandgap narrowing is independent of strain-induced bandgap lowering and arises only under illumination. The EQE data also clearly indicate excellent light-trapping properties due to the textured surface of GaN caused by residual etching. The cells without h-BN and GA modifications exhibit poor spectral response at long wavelengths, which progressively decreases over time. This confirms the importance of h-BN and GA modifications. In the EQE data, the cells without GA also exhibit compositional fluctuations due to ionic motion, with more incomplete collection of photo-generated charge. However, the high surface area of the GA helps to reduce fluctuations and improve collection efficiency.

Figure 6B:
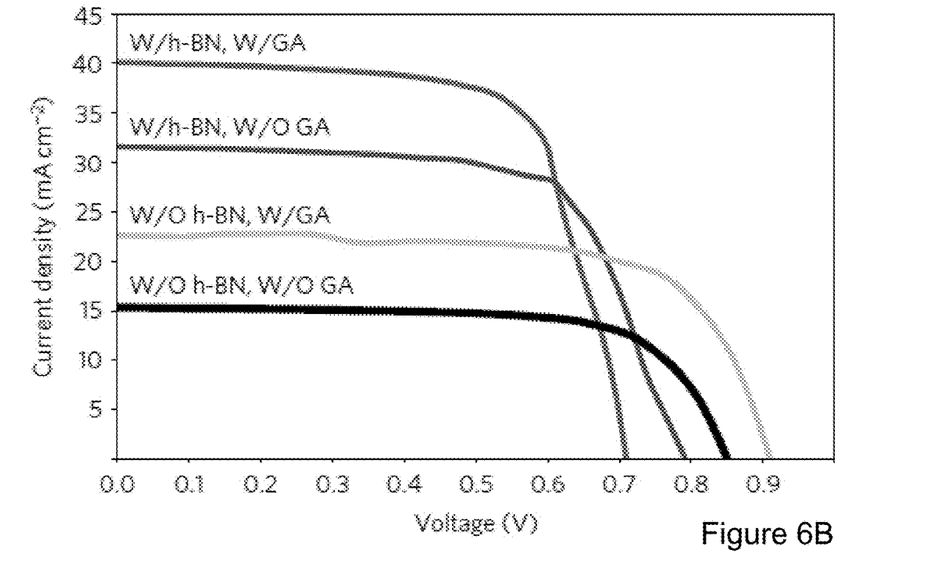

The current density-voltage (J-V) characteristics of these devices are shown in FIG. 6B. J-V parameters were measured under AM 1.5 illumination at an intensity of 1,000 W m$^{-2}$. The measured short-circuit current density ($J_{sc}$) ranges from ~25 mA cm$^{-2}$ to ~45 mA cm$^{-2}$. These large $J_{sc}$ values are record-setting for perovskite solar cells. Carrier multiplications, such as impact ionization and multi-exciton formation, might also play a role in $J_{sc}$ improvement, due to a strong built-in electric field in the device. The cells with GA and h-BN modifications show the highest current output and efficiency. Other current-voltage trends can also be seen in FIG. 6B. The graded bandgap formation (cells with GA and h-BN modifications) provides an effective built-in electric field, which also enhances the electron-hole collection efficiency but necessarily lowers the open-circuit voltage ($V_{oc}$). $V_{oc}$ ranges from ~0.64 V to ~0.9 V for these cells, and is limited by the lowest bandgap of the device.

Figure 7A:
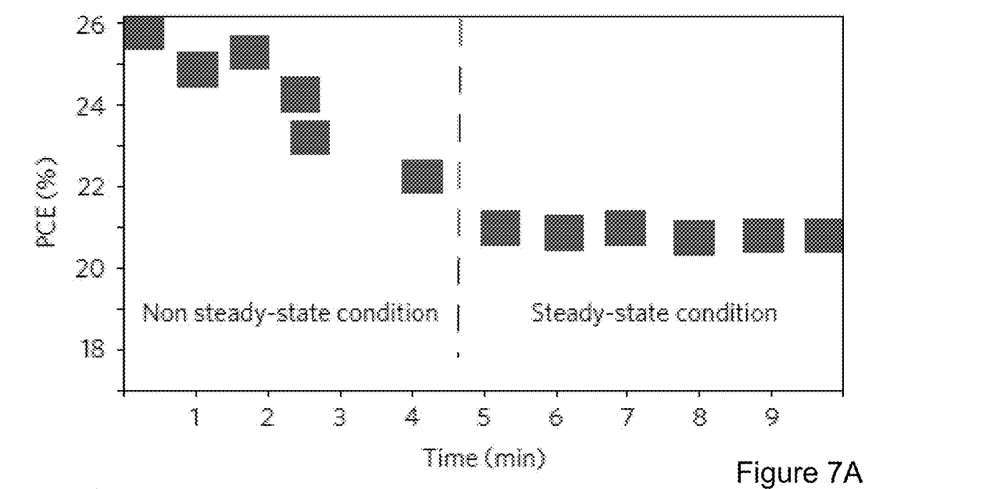
FIGS. 7A-7C show examples of the time evolution of perovskite cell performance, including a steady state histogram and best-cell current-voltage response.

The perovskite-based solar cells have time-dependent performance characteristics. Freshly illuminated cells tend to have higher PCE, for example, than cells that have been illuminated for more than a few minutes. FIG. 7A shows this trend for a given graded bandgap perovskite cell. Within the first two minutes of illumination and characterization, the PCE is between 25% and 26%. After approximately 5 minutes, the cell reaches a 'steady state', with stable performance (in this case a PCE of 20.8%). The performance characteristics stated in this specification are for the steady state.

Figure 7B:
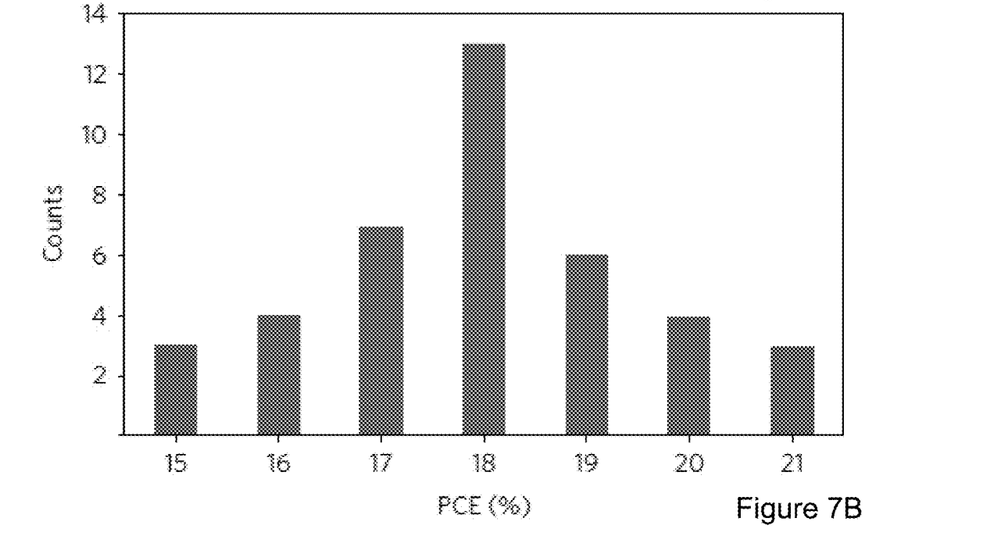
Figure 7C:
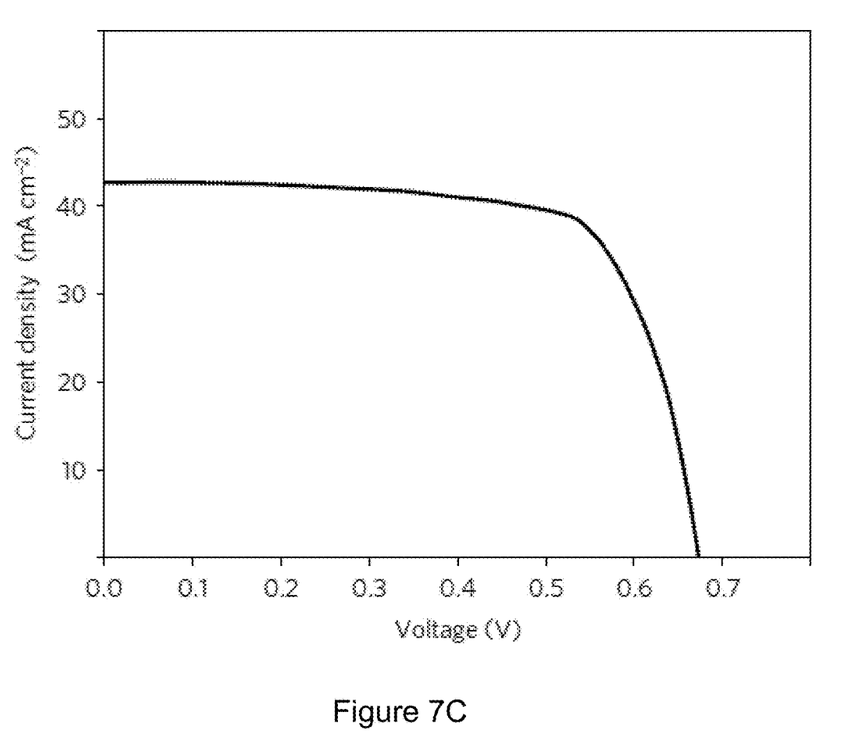

FIG. 7B shows a histogram for all 40 graded bandgap perovskite cells measured. The average steady-state PCE over all devices is 18.4%. The average fill factor (FF) for the same set of devices is 72%, and the cells consistently exhibit similar characteristics between reverse and forward sweep directions. The measured solar cell parameters of best graded bandgap cell in the steady state are $J_{sc}$=42.1 mA cm$^{-2}$, $V_{oc}$=0.688 V, FF=0.75 and PCE=21.7% (mean value of PCE=21.66%, surface area of 0.07 cm$^2$). The current density-voltage (J-V) characteristics of this cell are shown in FIG. 7C. The highest efficiency cells have $J_{sc}$=42.1 mA cm$^{-2}$ out of a possible 49.4 mA cm$^{-2}$ available for a bandgap ~1 eV under AM 1.5 global illumination.

Discussed further below are the architecture and internal functioning of the graded bandgap perovskite solar cells. Devices without a monolayer h-BN layer between the mixed halide double-layer perovskites exhibit almost no graded bandgap characteristics at any time. Moreover, such devices consistently exhibit low performance and a rapid photocurrent decrease (FIGS. 5, 6A, and 6B). This demonstrates that h-BN plays a role in facilitating the graded bandgap function. EDAX line mapping of cells with and without h-BN incorporation shows that Sn and Pb concentrations diminish from one layer to another at the h-BN interface, which demonstrates that h-BN acts as a diffusion barrier to prevent cation mixing. Devices with h-BN and GA modifications also exhibit stable electrical characteristics even under constant illumination. These characteristics are probably due to increased oxidation or segregation of iodide at the interfaces of h-BN and hole transport material/graphene aerogel. Furthermore, tin may tend to have stronger bonds with bromine at the h-BN interface, forming an intermediate medium of $CH_3NH_3SnBr_3$.

The graphene aerogel (GA) acts as a barrier to moisture ingress. The barrier may alleviate moisture penetrating into deeper depths of the absorber layer and help maintain the interface stability. It is well known that humidity exposure, or a decreasing iodide fraction, leads to a wider bandgap perovskite up to ~2.4 eV. EDAX line mapping of the oxygen signature of a perovskite with and without GA shows dramatic differences (not shown). GA also plays an important role in shaping the crystallinity and morphology of the perovskite film owing to its high surface area. The GA modification is important in obtaining highly crystalline and homogeneous perovskite films. It was found that without GA modifications, the perovskite films have significantly smaller grain sizes and form isolated perovskite islands rather than continuous films. Limiting the nucleation of small islands with the GA modification has the benefit of allowing for quick growth and aggregation, promoting large grain sizes. Furthermore, the mobility also exhibits a clear dependence on the presence of a GA layer; all of the films with a GA layer exhibit better performance than without it.

In summary, in the experiments described above, graded bandgap perovskite photovoltaic cells with good output current and power conversion efficiency were successfully prepared by implementing a new cell architecture. GaN was chosen to replace the typical $TiO_2$ electron transport layer to provide a better surface morphology and enhanced electron injection due to its ability to be heavily doped. A graphene aerogel makes an excellent barrier layer to moisture ingress and improves hole collection efficiency in the hole transport layer. The aerogel also promotes a more crystalline perovskite structure. Choosing the right metal cation and varying halide anion concentration also successfully establishes bandgap tuning of the perovskite absorber layer. The combination of GA and h-BN enables this bandgap formation, and this configuration produces cells that are reproducible and stable.

CONCLUSION

Further details regarding the embodiments described herein can be found in the publications (1) Onur Ergen, S. Matt Gilbert, Thang Pham, Sally J. Turner, Mark Tian Zhi Tan, Marcus A. Worsley, and Alex Zettl (2016), Graded bandgap perovskite solar cells. Nature Materials and (2) Ergen, O., Gilbert, S. M., Turner, S. J. and Zettl, A. (2016), Hexagonal boron nitride as a cationic diffusion barrier to form a graded bandgap perovskite heterostructure. Phys. Status Solidi B, 253: 2478-2480, both of which are hereby incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A solar cell comprising:
a first electrode;
a hole transport layer disposed on the first electrode;
a first perovskite layer disposed on the hole transport layer;
a cationic diffusion barrier disposed on the first perovskite layer;
a second perovskite layer disposed on the cationic diffusion barrier, the first perovskite layer comprising a different perovskite than the second perovskite layer, the first perovskite layer having a higher bandgap than the second perovskite layer;
an electron transport layer disposed on the second perovskite layer; and
a second electrode disposed on the electron transport layer.

2. The solar cell of claim 1, wherein the first perovskite layer comprises $CH_3NH_3PbI_{3-x}Br_x$.

3. The solar cell of claim 1, wherein the first perovskite layer comprises an organic-inorganic halide perovskite.

4. The solar cell of claim 1, wherein the first perovskite layer is about 30 nanometers to 200 nanometers thick.

5. The solar cell of claim 1, wherein the cationic diffusion barrier comprises hexagonal boron nitride.

6. The solar cell of claim 1, wherein the cationic diffusion barrier consists of a monolayer of hexagonal boron nitride.

7. The solar cell of claim 1, wherein the cationic diffusion barrier comprises a material selected from a group consisting of hexagonal boron nitride, graphene oxide, fluorinated graphene, graphane, germanate, a dichalcogenide, a two-dimensional carbide or nitride, silicene, a topological insulator, a two-dimensional polymer, and a metal organic framework.

8. The solar cell of claim 1, wherein second perovskite layer comprises $CH_3NH_3SnI_3$.

9. The solar cell of claim 1, wherein the second perovskite layer comprises an organic-inorganic halide perovskite.

10. The solar cell of claim 1, wherein second perovskite layer is about 30 nanometers to 200 nanometers thick.

11. The solar cell of claim 1, wherein the electron transport material comprises a material selected from a group consisting of gallium nitride, titanium dioxide, aluminum oxide, and silicon carbide.

12. The solar cell of claim 1, wherein the hole transport layer comprises a hole transport material and a graphene aerogel disposed therein.

13. The solar cell of claim 1, wherein the hole transport layer comprises a hole transport material selected from a group consisting of spiro-OMeTAD, poly(3-hexylthiophene-2,5-diyl) (P3HT), cuprous oxide, copper iodide, cuprous thiocyanate, carbazole, copper phthalocyanine, and copper doped nickel oxide.

14. The solar cell of claim 1, wherein the first perovskite layer comprises a first organic-inorganic halide perovskite, wherein the second perovskite layer comprises a second organic-inorganic halide perovskite, wherein a concentration of a first halide of the first perovskite layer decreases from the first perovskite layer to the second perovskite layer, and wherein a concentration of a second halide of second perovskite layer decreases from the second perovskite layer to the first perovskite layer.

15. The solar cell of claim 1, wherein the first perovskite layer comprises a first organic-inorganic halide perovskite, wherein the second perovskite layer comprises a second organic-inorganic halide perovskite, wherein a concentration of a first halide of the first perovskite layer decreases from the first perovskite layer to the second perovskite layer in a substantially linear manner, and wherein a concentration of a second halide of second perovskite layer decreases from the second perovskite layer to the first perovskite layer in a substantially linear manner.

16. A solar cell comprising:
a first electrode comprising a layer of gold;
a hole transport layer disposed on the first electrode, the hole transport layer comprising a layer of spiro-OMeTAD having a graphene aerogel disposed therein;
a first perovskite layer disposed on the hole transport layer, the first perovskite layer comprising a layer of $CH_3NH_3PbI_{3-x}Br_x$;
a cationic diffusion barrier disposed on the first perovskite layer, the cationic diffusion barrier comprising a monolayer of hexagonal boron nitride;
a second perovskite layer disposed on the cationic diffusion barrier, the second perovskite layer comprising a layer of $CH_3NH_3SnI_3$;
an electron transport layer disposed on the second perovskite layer, the electron transport layer comprising a layer of gallium nitride; and
a second electrode disposed on the electron transport layer, the second electrode comprising an alloy of titanium, aluminum, nickel, and gold.

17. A solar cell comprising:
a first electrode;
a hole transport layer disposed on the first electrode, the hole transport layer comprising a hole transport material and a graphene aerogel disposed in the hole transport material;
a perovskite layer disposed on the hole transport layer;
an electron transport layer disposed on the perovskite layer; and
a second electrode on the electron transport layer.

18. The solar cell of claim 17, wherein the graphene aerogel is doped.

19. The solar cell of claim 17, wherein the hole transport material is selected from a group consisting of spiro-OMeTAD, poly(3-hexylthiophene-2,5-diyl) (P3HT), cuprous oxide, copper iodide, cuprous thiocyanate, carbazole, copper phthalocyanine, and copper doped nickel oxide.

20. The solar cell of claim 17, wherein the perovskite layer comprises an organic-inorganic halide perovskite.

* * * * *